United States Patent
Hynecek et al.

(10) Patent No.: US 9,905,608 B1
(45) Date of Patent: Feb. 27, 2018

(54) EMCCD IMAGE SENSOR WITH STABLE CHARGE MULTIPLICATION GAIN

(71) Applicant: SEMICONDUCTOR COMPONENTS INDUSTRIES, LLC, Phoenix, AZ (US)

(72) Inventors: Jaroslav Hynecek, Allen, TX (US); Eric Stevens, Webster, NY (US); Christopher Parks, Pittsford, NY (US); Stephen Kosman, Geneseo, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/403,978

(22) Filed: Jan. 11, 2017

(51) Int. Cl.
H01L 27/148 (2006.01)
H01L 27/146 (2006.01)

(52) U.S. Cl.
CPC .. H01L 27/14825 (2013.01); H01L 27/14614 (2013.01); H01L 27/14643 (2013.01); H01L 27/14689 (2013.01); H01L 27/14812 (2013.01)

(58) Field of Classification Search
CPC ......... H01L 27/14614; H01L 27/14643; H01L 27/14689; H01L 27/14812; H01L 27/14825
See application file for complete search history.

(56) References Cited

U.S. PATENT DOCUMENTS

| | | | | |
|---|---|---|---|---|
| 3,623,026 A * | 11/1971 | Engeler | ................. | H01L 27/105 257/290 |
| 3,770,988 A * | 11/1973 | Engeler | ................ | G11C 19/285 257/215 |
| 3,909,925 A * | 10/1975 | Forbes | .................... | H01L 21/00 257/249 |
| 4,012,759 A * | 3/1977 | Esser | .................. | H01L 29/1091 257/220 |
| 4,077,112 A * | 3/1978 | Theunissen | ....... | H01L 21/28185 148/DIG. 114 |
| 4,646,119 A * | 2/1987 | Kosonocky | .......... | G11C 19/287 257/239 |
| 5,073,908 A * | 12/1991 | Cazaux | ................ | G11C 19/285 257/221 |
| 5,337,340 A * | 8/1994 | Hynecek | ........... | H01L 27/14831 257/217 |

(Continued)

OTHER PUBLICATIONS

Bosiers et al., "MEM-FLIM, a CCD Imager for Fluorescence Lifetime Imaging Microscopy"; 2013 International Image Sensor Workshop, Snowbird Resort, Utah, USA; Jun. 13, 2013.

(Continued)

*Primary Examiner* — Peniel M Gumedzoe
(74) *Attorney, Agent, or Firm* — Treyz Law Group, P.C.; Joseph F. Guihan

(57) ABSTRACT

In electron multiplying charge coupled device (EMCCD) image sensors, electron traps in the dielectric stack underneath charge multiplication electrodes may cause undesirable gain ageing. To reduce the gain ageing drift effect, a dielectric stack may be formed that does not include electron traps in regions underneath charge multiplication electrodes. To accomplish this, silicon nitride in the dielectric stack may be removed in regions underneath the charge multiplication electrodes. The EMCCD image sensors can thus be fabricated with a stable charge carrier multiplication gain during their operational lifetime.

13 Claims, 4 Drawing Sheets

(56) References Cited

U.S. PATENT DOCUMENTS

| 5,430,481 A | 7/1995 | Hynecek |
| 5,442,395 A | 8/1995 | Sekiguchi |
| 6,278,142 B1 | 8/2001 | Hynecek |
| 8,054,363 B2 | 11/2011 | Robbins |
| 2006/0163474 A1 | 7/2006 | Denvir |
| 2012/0147235 A1 | 6/2012 | Parks |

OTHER PUBLICATIONS

Kitano et al., "A 1.75 µm Square Pixel IT-CCD using Gate Oxide Insulator Composed by a Single Layer Electrode Structure"; 2007 International Image Sensor Workshop, Ogunquit, Maine, USA; Jun. 7, 2007.

Technical Note from Andor Technology, "Longevity in EMCCD and ICCD"; Mar. 14, 2006.

* cited by examiner

EMCCD IMAGE SENSOR WITH STABLE CHARGE MULTIPLICATION GAIN

BACKGROUND

This relates generally to image sensors and, more particularly, to electron multiplying charge coupled device (EMCCD) image sensors.

Modern electronic devices such as cellular telephones, cameras, and computers often use digital image sensors. Image sensors (sometimes referred to as imagers) may be formed from a two-dimensional array of image sensing pixels. Each pixel includes a photosensitive region that receives incident photons (light) and converts the photons into electrical signals. Image sensors are sometimes designed to provide images to electronic devices using a Joint Photographic Experts Group (JPEG) format.

Conventional image pixel arrays may be fabricated on a semiconductor substrate using complementary metal-oxide-semiconductor (CMOS) technology or charge-coupled device (CCD) technology. Certain CCD image sensors, referred to as electronic multiplying charge coupled device (EMCCD) image sensors, have high sensitivity and multiply collected charge in the charge domain using a single carrier impact ionization process before charge is converted into a voltage at the CCD charge detection output node. However, EMCCD image sensors may experience a gain ageing effect where trapped electron charge builds up during the device operation lifetime. The trapped electron charge causes a significant potential shift in the silicon under the charge multiplication gate, which reduces the charge multiplication gain.

It would therefore be desirable to be able to provide improved EMCCDs with stable charge multiplication gain.

DETAILED DESCRIPTION

Figure 1:
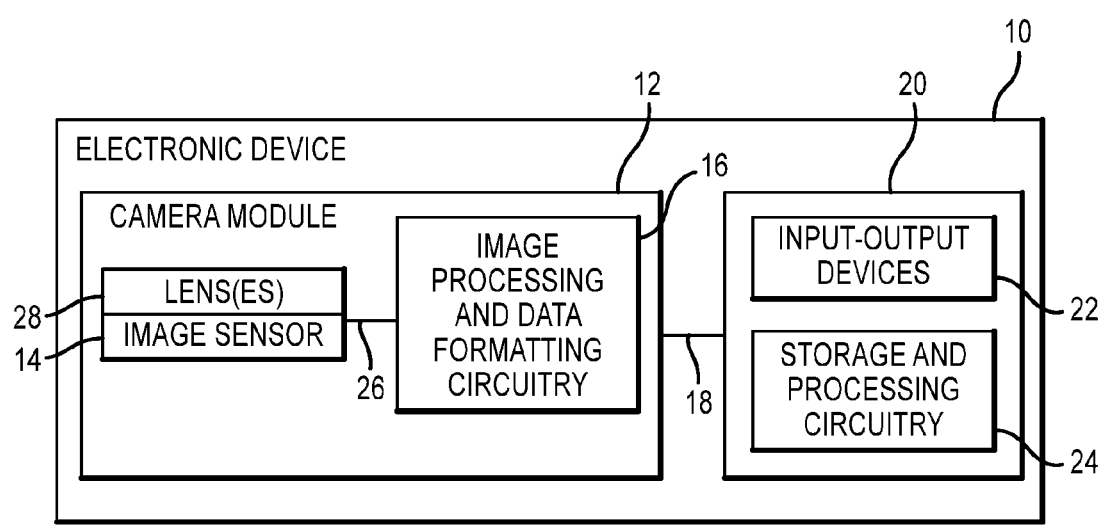
FIG. 1 is a schematic diagram of an illustrative electronic device with an EMCCD image sensor in accordance with an embodiment of the present invention.

Embodiments of the present invention relate to EMCCD image sensors. An electronic device with a digital camera module that includes an EMCCD image sensor is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., photodiodes) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, phase detection, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Image sensor 14 may be an EMCCD image sensor. EMCCD image sensors may have high sensitivity and may multiply collected charge in the charge domain using a single carrier impact ionization process before charge is converted into a voltage at the CCD charge detection output node. EMCCD image sensor 14 may have a charge multiplying CCD register structure that has a stable charge multiplication gain without a gain ageing effect.

CCD image sensors such as image sensor 14 may sense light by converting impinging photons into electrons that are integrated (collected) in the image sensing area array of sensor pixels. After completion of integration, collected electrons may be transported into a suitable charge storage area by the CCD transfer process. Collected electrons may then be transported from the charge storage area into the charge detection node where electron charge is converted into a voltage. The resulting voltage may then be supplied to the output terminals of the sensor using a suitable voltage buffer amplifier, typically a single stage or a double stage source follower.

Image sensor 14 may be implemented in any desired architecture. For example, image sensor 14 may be a full-frame (FF) or frame-transfer (FT) device. In both FF and FT devices, charge may be integrated directly in the column pixels of the image area array registers. In FT image sensors, charge from all of the columns may then be transferred in parallel into memory area array pixels as a block of frame data. FF image sensors may not have a memory area and may use a mechanical shutter to block off light during the readout that is performed directly from the image sensing area.

Image sensor 14 may also be a frame interline transfer (FIT) device, an interline transfer (IT) device, or a line sensor (LS) device. In general, image sensor 14 may be any desired type of CCD image sensor. All of the aforementioned types of device architectures employ one or several serial registers that transport charge into the charge detection node and an amplifier for conversion into a voltage.

Image sensor 14 may be an EMCCD. In EMCCDs, which are electron multiplying CCDs, a special serial register or a section of the serial register is included in the architecture where higher voltage clocks are applied to some of the register gates. This causes creation of high fields between the gates and, as a consequence, single carrier multiplication by impact ionization during the charge transport. The single carrier multiplication by impact ionization results in multiplication of all collected charge before its conversion into a voltage at the output node of the charge detection buffer amplifier. This process greatly increases the device sensitivity and at the same time improves noise that would otherwise be determined by the amplifier noise floor.

Application of higher voltage swings to the charge multiplication register gates, however, may present a problem. Accelerated electrons create additional electrons by the impact ionization process as desired. However, the accelerated electrons and impact ionization also can cause the injection of "hot electrons" into the gate dielectric region under the gate. These dielectric regions may be built using a silicon dioxide and silicon nitride (ON) stack structure or a silicon dioxide, silicon nitride, and silicon dioxide (ONO) stack structure. Such dielectric stack structures may be used for a variety of reasons depending on the specific application and characteristics of the image sensor. However, the stack structures of these layers exhibit a number of interface states where the different dielectrics meet, which traps injected "hot electrons" and prevents them from entering back into the underlying silicon. This trapped electron charge builds up during the device operational lifetime and causes a significant potential shift in the silicon under the charge multiplication gate, which reduces the charge multiplication gain. As a result it is necessary to keep increasing the amplitude of pulses that are applied to the charge multiplication gate to keep the value of the selected charge multiplication gain constant. This is an undesirable effect called the "gain drift", which can detrimentally effect performance of EMCCD sensors.

In order to provide an EMCCD image sensor register design that eliminates the charge multiplication gain drift, the dielectric region below the charge multiplication gate may be formed without silicon nitride (which traps the "hot electrons"). Without the presence of the silicon nitride, "hot electrons" injected into the oxide may return back to the silicon without charge build up (therefore avoiding the potential threshold shift of the charge multiplication gate). The dielectric region below the charge multiplication gate may be formed only with materials that do not have electron traps.

Figure 2:
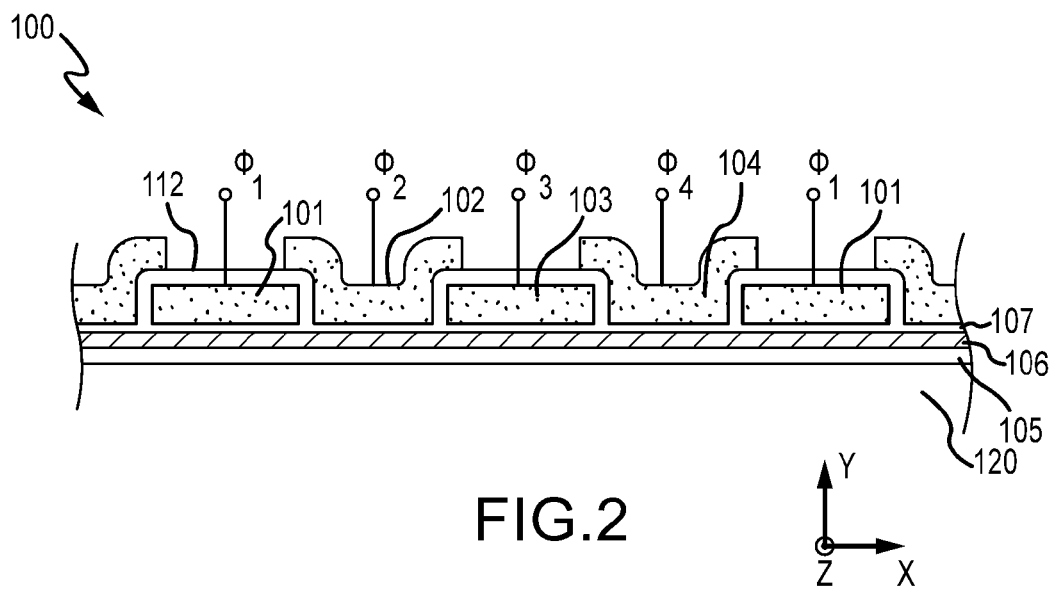
FIG. 2 is a cross-sectional side view of a section of an EMCCD image sensor serial register in accordance with an embodiment of the present invention.

FIG. 2 is a cross-sectional side view of an EMCCD serial register 100 where the charge multiplication through the impact ionization process occurs. EMCCD serial register 100 may include polysilicon gates 101, 102, 103, and 104. Gate biasing voltage Φ1 may be applied to polysilicon gate 101, gate biasing voltage Φ2 may be applied to polysilicon gate 102, gate biasing voltage Φ3 may be applied to polysilicon gate 103, and gate biasing voltage Φ4 may be applied to polysilicon gate 104. The gate biasing voltages may be used to accomplish the charge transfer and the charge multiplication.

Gates 101, 102, 103, and 104 may be deposited on bulk silicon substrate 120. Gates 101, 102, 103, and 104 may be isolated from the silicon substrate by one or more dielectric layers. As shown in FIG. 2, silicon dioxide layer 105, silicon nitride layer 106, and silicon dioxide layer 107 may be used to isolate the gates from the silicon substrate. This arrangement of a silicon oxide layer, silicon nitride layer, and silicon oxide layer may sometimes be referred to as an ONO layer or ONO structure. If desired, silicon dioxide layer 107 may be removed and only silicon dioxide layer 105 and silicon nitride layer 106 may separate the gates from silicon substrate 120. This arrangement of a silicon oxide layer and silicon nitride layer may sometimes be referred to as an ON structure or ON layer. The gates may also be isolated from each other by silicon dioxide layer 112.

Figure 3:
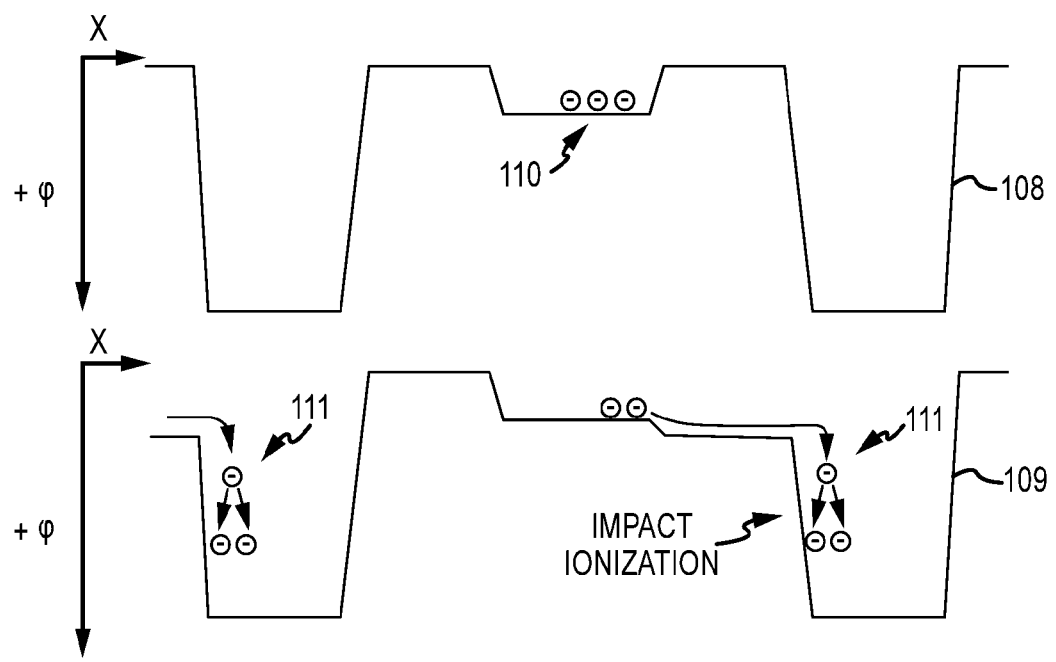
FIG. 3 shows the maximum potential profiles along the register of FIG. 2 for different gate biasing conditions and the location of the impact ionization charge carrier multiplication regions in accordance with an embodiment of the present invention.

FIG. 3 shows the maximum potential profiles along register 100 of FIG. 2 for different gate biasing conditions and the location of the impact ionization charge carrier multiplication regions. Applying suitable bias voltages to gates 101, 102, 103, and 104 causes a certain potential profile to form in the bulk of the Silicon substrate under these gates. This is shown by the maximum potential profile curve 108. The potential profile forms potential wells and barriers along the register length, which confine in them charge packets 110 as is shown in the graph. When the bias on the gate 104 is increased, as shown in the graph 109, electrons begin to flow to the potential well under the gate 101. During this charge transfer, electrons encounter a high field region that has been previously formed between these gates and through the process of impact ionization 111 sometimes multiply. This process is repeated many times during the charge transfer along the register length resulting in a significant final charge multiplication value.

However, not all of the electrons end up in the next well of the register. Some electrons are occasionally injected into the ONO gate dielectric stack where they stay trapped at the interface states between the silicon oxide and silicon nitride layers. The resulting charge buildup in the dielectric stack causes the gate electrode threshold shift. This threshold shift necessitates additional increase of the charge multiplication gate bias voltage level and this is an undesirable effect called gain ageing.

Figure 4:
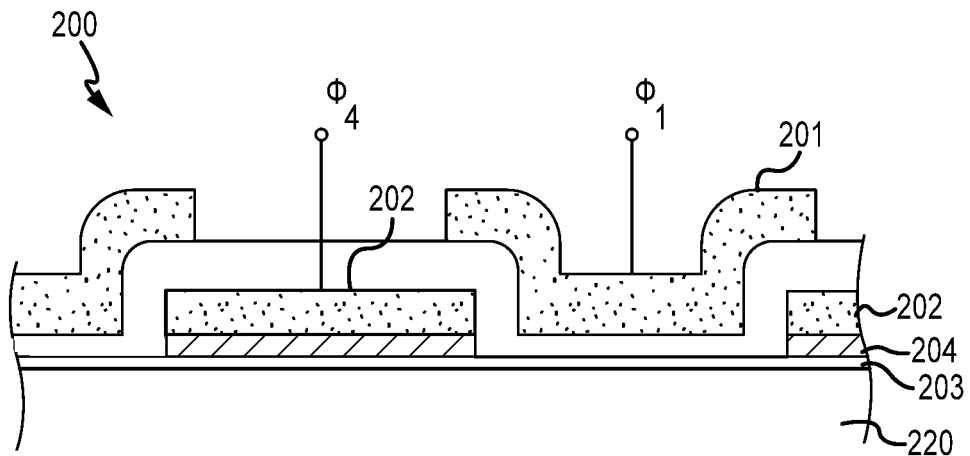
FIG. 4 is a cross-sectional side view of a section of an EMCCD image sensor serial register with dielectric material free of electron traps under the charge multiplication gate in accordance with an embodiment of the present invention.

FIG. 4 is a cross-sectional side view of a section of an EMCCD image sensor serial register 200 with dielectric material free of electron traps under the charge multiplication gate in accordance with an embodiment of the present invention. As shown in FIG. 4, EMCCD image sensor serial register 200 may include polysilicon gates 201 and 202. Gate biasing voltage Φ1 may be applied to polysilicon gate 201 and gate biasing voltage Φ4 may be applied to polysilicon gate 202. Silicon dioxide layer 203 and silicon nitride layer 204 may separate polysilicon gates 202 from silicon substrate 220. In the region under charge multiplication gate 201, the silicon nitride layer may not be present to remove electron traps that cause gain ageing.

Figure 5:
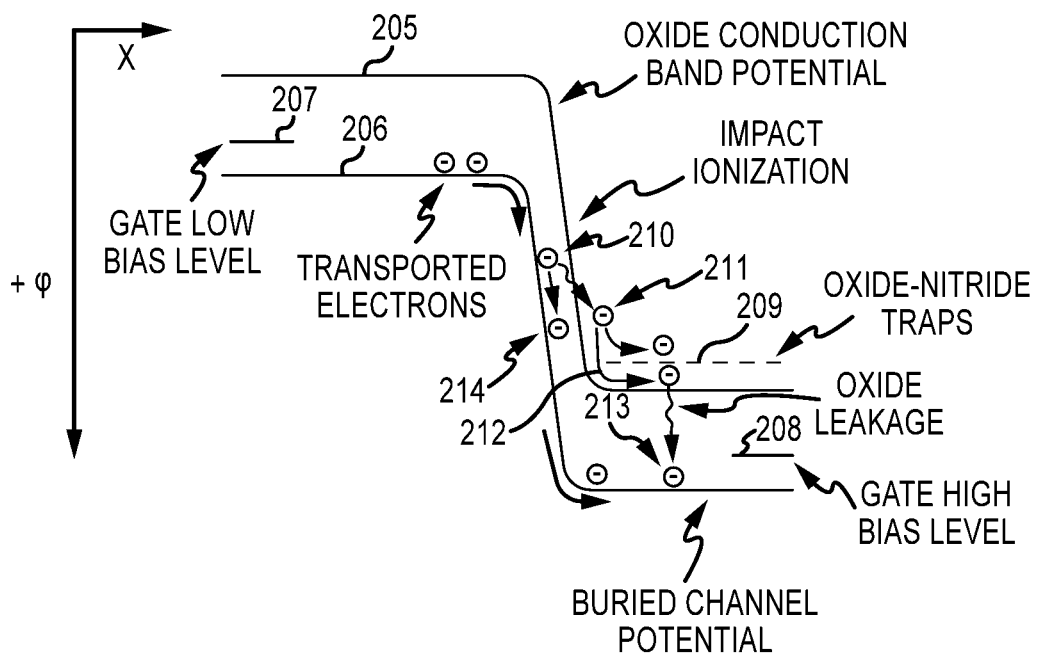
FIG. 5 shows the potential profile (band diagram) details in the region between the two adjacent gates of FIG. 4 one of which is the charge multiplication gate biased at a high voltage level where the impact ionization occurs in accordance with an embodiment of the present invention.

FIG. 5 shows the simplified band diagram of the portion of the EMCCD register 200 of FIG. 4 in the regions between the gate 201, which is biased at the high voltage level 208 and the gate 202, which is biased at the low voltage level 207. In this embodiment, the gates 202 are isolated from silicon substrate 220 by silicon oxide layer 203 and silicon nitride layer 204 forming an ON dielectric gate stack.

In FIG. 5, the oxide conduction band diagram is represented by the curve 205 and the buried channel potential in the silicon bulk is represented by the curve 206. As the electrons enter the high field region between these two gate electrodes the impact ionization occurs at the location 210 where the new charge carriers are generated. In most cases, the new carriers 214 follow the buried channel potential all the way to the potential well under the gate that is biased at the high voltage level 208. However, in some cases new carriers 211 are injected into the oxide and follow the conduction band 205. The carriers then sometimes become trapped in traps 209 when the traps are present in the dielectric stack. The traps may, for example, be located at an interface region between silicon oxide and silicon nitride layers.

When the silicon nitride is not present in the dielectric stack the carriers 212 follow the oxide conduction band and eventually end up in the potential well under the gate that is biased at the high voltage level 208. This is indicated by the transition 213. Silicon dioxide is very slightly conductive, which facilitates the transition of electrons from the silicon oxide to the silicon substrate 220.

Figure 6:
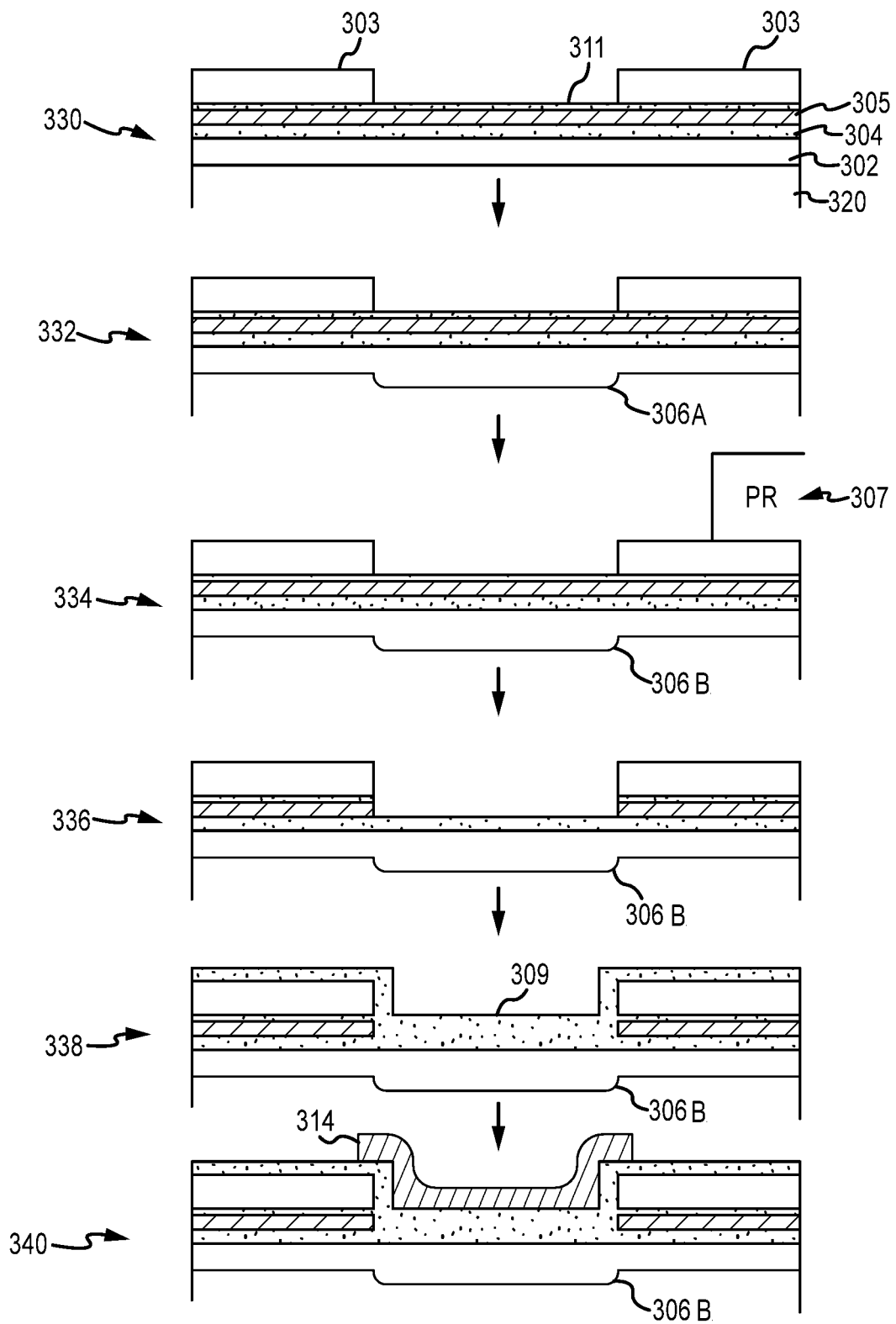
FIG. 6 is a cross-sectional side view of a fabrication process for an EMCCD image sensor serial register in accordance with an embodiment of the present invention.

Therefore, by removing traps 209 from the dielectric stack, gate threshold shift caused by accumulated charge and the corresponding EMCCD gain ageing problem can be eliminated. To remove traps from the dielectric stack under the multiplication gate, silicon nitride may be removed from the dielectric stack (as shown in FIGS. 4 and 6). Other types of dielectric material may also be used in this region. In general, any dielectric material (or combination of materials) that is free of electron traps may be used.

It is also possible to implant the dielectric stack with certain implant species such as carbon or silicon to make it hot electron hard. The implantation of carbon or silicon into the dielectric under the charge multiplication gate of EMCCD registers is another way to eliminate the gain aging problem from EMCCD registers.

FIG. 6 shows a portion of the EMCCD fabrication sequence applied to the section of the CCD register that has the multiplication gates. At step 330, a silicon substrate 320 may be provided that has a buried channel implant region 302 implanted in it. The buried channel implant region 302 may be an n-type buried channel that is formed prior to formation of polysilicon gates 303. Silicon substrate 320 may be covered by silicon dioxide layer 304, silicon nitride layer 305, and another silicon dioxide layer 311, thus forming an ONO gate dielectric stack. The structure may also include first polysilicon gate electrodes 303 deposited on top of the ONO stack. These steps may be applied to the whole image sensor array and all the registers that may not include the multiplication sections. In other words, portions of the image sensor may be CCD registers without electron multiplication, while some portions of the image sensor may be CCD registers with electron multiplication (i.e., EMCCD registers).

In step 332, storage-region implant 306A may be formed to create 2-phase serial CCD registers and EMCCD registers. Polysilicon gates 303 may act as the mask for implanting storage-region implant 306A. Storage-region implant 306A may be, for example, an n-type implant. Both the serial CCD registers and EMCCD registers may have structures shown in step 330 and 332. However, only the EMCCD registers may undergo steps 334-340.

At step 334, a photoresist 307 may be deposited and patterned on top of the structure. Photoresist 307 may cover all of the CCD registers without electron multiplication while leaving the EMCCD register uncovered. Photoresist 307 may prevent all of the other CCD registers from being etched in step 336. In addition, photoresist 307 in combination with the first polysilicon electrodes 303 may act as a mask for an optional additional storage-region implant. Implant regions 306B in steps 334, 336, 338, and 340 are implant regions that have received both the first storage-region implant (306A in step 332) and the second storage-region implant (in step 334). The optional storage-region implant in step 334 may be used to adjust the channel potential of the multiplying gates within the EMCCD. The optional storage-region implant may be an n-type implant. At step 336, silicon dioxide layer 311 and silicon nitride layer 305 are shown as having been etched off. The etching of silicon dioxide layer 311 and silicon nitride may be completed after the additional storage-region implant is implanted in step 334. In all of the other CCD registers, photoresist 307 may prevent etching. In the EMCCD registers that are uncovered by photoresist 307, patterned polysilicon gates 303 may act as a mask to ensure etching of the silicon oxide and silicon nitride layers in the region above implant region 306B. Silicon dioxide layer 311 may be removed in a first etching process and silicon nitride layer 305 may subsequently be removed in a second, separate etching process. After etching dielectric layers 305 and 311, photoresist 307 may be stripped off.

Next, at step 338, additional silicon dioxide may be deposited or grown in the whole array. This additional silicon dioxide layer 309 may ensure that the electrically equivalent thickness of the dielectric stack under the charge multiplication gates may match the thickness of the dielectric stack under gates 303. The additional silicon dioxide layer 309 may also isolate the gates 303 and 314 from each other (similar to silicon dioxide layer 112 in FIG. 2).

Finally, at step 340, second polysilicon gate electrodes 314 (e.g., charge multiplication electrodes) may be formed over the implant region 306B. As shown in FIG. 6, the dielectric layers under charge multiplication gate 314 include only silicon dioxide (and no silicon nitride). The processing sequence of FIG. 6 therefore eliminates the silicon nitride from the gate oxide stack under the charge multiplication gates. Additional steps may be performed at this point such as contact hole etching via formation, deposition of several levels of metallization, etc.

The example of FIG. 6 is merely illustrative, and these techniques may be applied to other structures to form EMCCDs without gate ageing. For example, in an alternate embodiment the dielectric stack at step 330 may include only a first layer of silicon dioxide and a first layer of silicon nitride (e.g., an ON stack). Processing may continue as shown in FIG. 6 such that the final sensor had an ON stack beneath the first polysilicon gates (e.g., gates 303) and only silicon dioxide beneath the charge multiplication gates of the EMCCD registers (e.g., gate 314). The structures produced using the methods of FIG. 6 may have a multiplication gate electrodes with stable threshold voltage and no gain ageing.

In conclusion, EMCCD image sensors with stable charge multiplication gain may be formed by eliminating silicon nitride from the dielectric stack under the charge multiplication gate of serial registers and replacing it with only silicon dioxide. The examples of silicon nitride and silicon oxide are merely illustrative, and other dielectric materials may be used if desired. In general, a dielectric stack with electron traps may be modified so that regions of the dielectric stack underneath the charge multiplication gates do not have electron traps.

In various embodiments, a charge coupled device (CCD) image sensor may have at least one charge coupled device register. The at least one charge coupled device register may include a silicon substrate, a plurality of gates formed over the silicon substrate, a charge multiplication section, and at least one dielectric layer formed between charge multiplication gates and the silicon substrate. The charge multiplication gates may be interposed between gates of the plurality of gates in the charge multiplication section and electrons transported in the charge multiplication section may undergo impact ionization. The at least one dielectric layer may be free of electron traps between the charge multiplication gates and the silicon substrate.

The at least one dielectric layer may include first portions that are formed under the charge multiplication gates and second portions that are formed under the plurality of gates. The first portions of the at least one dielectric layer may include only silicon dioxide. The second portions of the at least one dielectric layer may include a first layer of silicon dioxide, a layer of silicon nitride, and a second layer of silicon dioxide. The second portions of the at least one dielectric layer may include a layer of silicon dioxide and a layer of silicon nitride. Only silicon dioxide may be included in the at least one dielectric stack in regions of the at least one dielectric stack below the charge multiplication gates. Silicon dioxide and silicon nitride may be included in the at least one dielectric stack in regions of the at least one dielectric stack below the plurality of gates. The at last one dielectric layer may include electron traps between the plurality of gates and the silicon substrate. The silicon substrate may include a buried implant region that extends under the plurality of gates and the charge multiplication gates and the silicon substrate may include an additional storage-region implant under only the charge multiplication gates.

A method of forming a charge coupled device register for a charge coupled device (CCD) image sensor may include forming a dielectric stack over a silicon substrate that includes a layer of silicon dioxide and a layer of silicon nitride, forming a first plurality of polysilicon gates over the dielectric stack, etching the dielectric stack to remove the layer of silicon nitride in regions between gates of the first plurality of polysilicon gates using the first plurality of polysilicon gates as a masking layer, and forming a second plurality of polysilicon gates over the regions between gates of the first plurality of polysilicon gates. The dielectric stack may not include silicon nitride under the second plurality of polysilicon gates and the dielectric stack may include silicon nitride under the first plurality of polysilicon gates.

The dielectric stack may include an additional layer of silicon dioxide and etching the dielectric stack to remove the layer of silicon nitride may include etching the dielectric stack to remove both the layer of silicon nitride and the additional layer of silicon dioxide. The method may also include forming an additional layer of silicon dioxide over the regions between gates of the first plurality of polysilicon gates after etching the dielectric stack to remove the layer of silicon nitride and before forming the second plurality of polysilicon gates. The method may also include forming a photoresist over portions of the charge coupled device image sensor that are not electron multiplying charge coupled device regions before etching the dielectric stack. The silicon substrate may include an n-type buried implant channel that extends under the first and second plurality of polysilicon gates. The method may also include implanting an additional storage-region implant in the regions of the silicon substrate that are uncovered by the first plurality of polysilicon gates using the first plurality of polysilicon gates and the photoresist as a masking layer.

A charge coupled device (CCD) image sensor may include at least one charge coupled device register. The at least one charge coupled device register may include a substrate, a first plurality of gates formed over the substrate, a second plurality of gates formed over the substrate, and at least one dielectric layer formed between the substrate and the first and second pluralities of gates. Each gate of the second plurality of gates may be interposed between respective first and second gates of the first plurality of gates, the at least one dielectric layer may include only silicon dioxide in regions of the at least one dielectric layer below the second plurality of gates, and the at least one dielectric layer may include silicon dioxide and silicon nitride in regions of the at least one dielectric layer below the first plurality of gates.

The second plurality of gates may include charge multiplication gates. The at least one dielectric layer may include a layer of silicon nitride and first and second layers of silicon dioxide in the regions of the at least one dielectric layer below the first plurality of gates. The first plurality of gates may include polysilicon gates and the second plurality of gates may include polysilicon gates. The substrate may be a silicon substrate with an n-type buried implant region that extends under the first and second pluralities of gates. The silicon substrate may include an additional storage-region implant under only the second plurality of gates.

The foregoing is merely illustrative of the principles of this invention and various modifications can be made by those skilled in the art without departing from the scope and spirit of the invention.

What is claimed is:

1. A charge coupled device (CCD) image sensor with at least one charge coupled device register, the at least one charge coupled device register comprising:
   a silicon substrate;
   a plurality of gates formed over the silicon substrate;
   charge multiplication gates that are interposed between gates of the plurality of gates, wherein electrons transported by the charge multiplication gates undergo impact ionization; and
   at least one dielectric layer formed between the charge multiplication gates and the silicon substrate, wherein the at least one dielectric layer is free of electron traps between the charge multiplication gates and the silicon substrate, wherein the at least one dielectric layer comprises first portions that are formed under the charge multiplication gates and second portions that are formed under the plurality of gates, wherein the first portions of the at least one dielectric layer include only silicon dioxide, and wherein the second portions of the at least one dielectric layer include a first layer of silicon dioxide, a layer of silicon nitride, and a second layer of silicon dioxide.

2. The charge coupled device image sensor defined in claim 1, wherein the at least one dielectric layer includes electron traps between the plurality of gates and the silicon substrate.

3. The charge coupled device image sensor defined in claim 1, wherein the silicon substrate comprises a buried implant region that extends under the plurality of gates and the charge multiplication gates and wherein the silicon substrate comprises an additional storage-region implant under only the charge multiplication gates.

4. A charge coupled device (CCD) image sensor with at least one charge coupled device register, the at least one charge coupled device register comprising:
   a substrate;
   a first plurality of gates formed over the substrate;
   a second plurality of gates formed over the substrate, wherein each gate of the second plurality of gates is interposed between respective first and second gates of the first plurality of gates; and
   at least one dielectric layer formed between the substrate and the first and second pluralities of gates, wherein the at least one dielectric layer includes only silicon dioxide in regions of the at least one dielectric layer below the second plurality of gates and wherein the at least one dielectric layer includes a layer of silicon nitride and first and second layers of silicon dioxide in the regions of the at least one dielectric layer below the first plurality of gates.

5. The charge coupled device image sensor defined in claim 4, wherein the second plurality of gates comprises charge multiplication gates.

6. The charge coupled device image sensor defined in claim 4, wherein the first plurality of gates comprises polysilicon gates and wherein the second plurality of gates comprises polysilicon gates.

7. The charge coupled device image sensor defined in claim 4, wherein the substrate is a silicon substrate with an n-type buried implant region that extends under the first and second pluralities of gates.

8. The charge coupled device image sensor defined in claim 7, wherein the silicon substrate comprises an additional storage-region implant under only the second plurality of gates.

9. A charge coupled device (CCD) image sensor with at least one charge coupled device register, the at least one charge coupled device register comprising:
   a silicon substrate;
   first and second gates formed over the silicon substrate;
   a third gate that is interposed between the first and second gates; and
   at least one dielectric layer formed between the third gate and the silicon substrate, wherein only silicon dioxide is included in the at least one dielectric layer in regions of the at least one dielectric layer below the third gate and wherein first and second layers of silicon dioxide and a layer of silicon nitride are included in the at least one dielectric layer in regions of the at least one dielectric layer below the first and second gates.

10. The charge coupled device image sensor defined in claim 9, wherein the at least one dielectric layer is free of electron traps between the third gate and the silicon substrate.

11. The charge coupled device image sensor defined in claim 9, wherein electrons transported by the third gate undergo impact ionization.

12. The charge coupled device image sensor defined in claim 9, wherein the third gate is a charge multiplication gate.

13. The charge coupled device image sensor defined in claim 9, wherein the layer of silicon nitride is interposed between the first and second layers of silicon dioxide.

\* \* \* \* \*